May 20, 1958 J. WIJTSMA 2,835,813
DEVICE FOR FINE TUNING OF A RESONANT CIRCUIT
Filed March 17, 1955
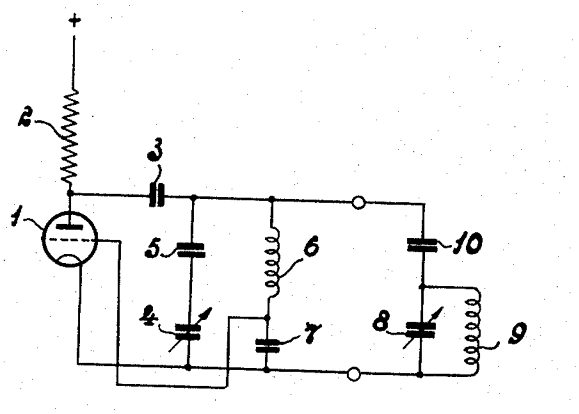
INVENTOR
JAN WIJTSMA
BY [signature]
AGENT

United States Patent Office 2,835,813
Patented May 20, 1958

2,835,813

DEVICE FOR FINE TUNING OF A RESONANT CIRCUIT

Jan Wijtsma, Eindhoven, Netherlands, assignor, by mesne assignments, to North American Philips Company, Inc., New York, N. Y., a corporation of Delaware Application March 17, 1955, Serial No. 494,896

Claims priority, application Netherlands April 26, 1954

2 Claims. (Cl. 250—36)

The present invention relates to a resonant circuit arrangement. More particularly, the invention relates to a device for the fine tuning of a resonant circuit, which can be tuned coarsely by means of a variable capacitor. Such devices are used in radio receivers, more particularly for the reception of short-waves, if a so-called bandspread is desired. In this case, by means of the capacitor for coarse tuning approximately the center of a shortwave band is first tuned, after which the desired station of this band is tuned in with the aid of a fine-tuning element.

It is known with circuits comprising an unvariable inductor and a variable tuning capacitor to obtain fine tuning by including in the circuit a small variable series inductor. As an alternative, use may be made of a large, parallel-connected inductor. In such a device the relative frequency variation which may be obtained by means of the variable inductor, does not vary with the adjustment of the variable capacitor. The absolute width of the frequency range to be governed by means of the finetuning element is, consequently, proportional to the frequency to be tuned by means of the main tuning element. However, since the various short-wave bands have approximately equal widths, this is not what is, in general, wanted. A fine tuning is wanted, in which the absolute width of the frequency range to be governed by means of the fine-tuning element is substantially independent of the position of the variable capacitor.

Moreover, it is often preferred to perform the fine adjustment by means of a variable capacitor having a small maximum capacity. In receiving apparatus suitable for the reception of frequency-modulated oscillations, for example, the tuning capacitor for these oscillations may serve, with the reception of the said short waves, for fine adjustment.

If in parallel with the main tuning capacitor of the circuit a variable capacitor of lower capacity is connected, it is, of course, possible to vary, by means of the latter capacitor, the natural frequency of the circuit within a given range. In this case, however, the maximum frequency width of this range does not only vary with the frequency to which the circuit is adjusted by means of the main tuning capacitor, but also with the capacitor of the latter. It is obvious that, if in this case frequency variation with fine tuning is wanted to be independent of the position of the main tuning element, the capacity variation to be obtained by means of the auxiliary tuning capacitor has to be inversely proportional to the third power of the natural frequency of the circuit.

The invention has for its object to provide a device for fine adjustment of a resonant circuit, which can be coarsely tuned by means of a main variable capacitor, in which the fine adjustment is performed by means of an auxiliary second variable capacitor of low maximum capacity and in which the frequency band to be governed by means of the latter capacitor is substantially independent of the position of the first-mentioned variable capacitor.

In accordance with the present invention, the second variable, or auxiliary, capacitor is connected in parallel with an inductor in the circuit, this inductor being chosen to be such that the parallel combination has a natural frequency which always exceeds the maximum tuning frequency of the circuit as an inductor, the value of which increases with an increase in capacity of the auxiliary capacitor.

The various elements may be readily chosen to be such that the maximum frequency variation thus occurring is substantially independent of the position of the main tuning capacitor or is dependent thereupon at least to a considerably smaller extent than in the case of direct parallel connection of the auxiliary capacitor to the circuit.

The said parallel combination is preferably connected in series with an unvariable capacitor in parallel with the circuit, the capacity of the last-mentioned capacitor being so high that the resonance frequency of the series combination is always lower than the tuning frequency of the circuit. This series combination thus also operates as an inductor.

In order that the invention may be readily carried into effect, it will now be described more fully with reference to the accompanying drawing, wherein the single figure is a schematic diagram of an embodiment of the device of the present invention.

It is assumed that the invention is applied to the oscillator circuit of a receiving apparatus. Referring to the figure, reference numeral 1 designates the oscillator tube, the anode of which is connected through a supply resistor 2 to the positive terminal of the source. The anode is connected through a capacitor 3 to the resonant circuit which determines the frequency of the oscillator. This circuit is tuned coarsely by means of a capacity 4, the rotor of which may be coupled mechanically in known manner with the rotors of the tuning capacitors of the preceding high-frequency circuits (not shown). The circuit also includes an inductor 6, an unvariable capacitor 5, which serves to shorten the frequency range governed by it to a given value, and a capacitor 7. The common point of the capacitor 7 and the inductor 6 is connected to the control-grid of the tube 1, so that a capacitative delta connection (Colpitts connection) is obtained. By means of the capacitor 4 the circuit may be tuned within a comparatively wide range of short waves, which includes also a few short-wave bands.

In order to obtain bandspread for each short-wave band, provision is made of a fine-tuning capacitor 8. To this end, as has been found, use may be made of the capacitor which serves to tune to the higher frequency-modulated oscillations and which may for example be varied between 4 and 13 micromicrofarads. If necessary, in order to shorten the frequency range to be covered, this capacitor may be connected in series with an unvariable capacitor. In parallel with the capacitor 8 is connected the inductor 9, which has an inductance such that the parallel combination exhibits a resonance frequency which exceeds the maximum oscillator frequency. This parallel combination in the embodiment shown is connected through a capacitor 10 in parallel with the oscillator circuit. The capacitor 10 has a high capacity, so that the series combination 8, 9, 10 has a resonance frequency which is lower than the lowest oscillator frequency. Instead of using the capacitor 10 use could be made of an inductor. When going over to another frequency range, which also includes a plurality of shortwave bands, the inductor 9 should, in general, be interchanged simultaneously with the inductor 6. The capacitor 8 may remain in circuit for all frequency ranges.

It has been found that a variation of the capacity of the capacitor 8 gives rise to a frequency variation of the oscillator circuit, which depends only little on the position of the capacitor 4.

While the invention has been described by means of a specific example and in a specific embodiment, I do not wish to be limited thereto, for obvious modifications will occur to those skilled in the art without departing from the spirit and scope of the invention.

What is claimed is:

1. A resonant circuit arrangement having input terminals, comprising means for applying input oscillations to said input terminals, a first variable capacitor and a first inductor connected in parallel relationship between said input terminals for adjusting the frequency of said circuit arrangement in relatively broad increments, a second variable capacitor for adjusting the frequency of said circuit arrangement in relatively narrow increments independently of said first variable capacitor, said second variable capacitor having a relatively low maximum capacitance, a second inductor connected in parallel circuit arrangement with said second variable capacitor, said second inductor having an inductance value at which the resonant frequency of said last-mentioned parallel circuit arrangement exceeds the resonant frequency of said resonant circuit arrangement, a reactive impedance connected in series circuit arrangement with said last-mentioned parallel circuit arrangement, said reactive impedance having a reactance value at which the resonant frequency of said series circuit arrangement is less than the resonant frequency of said resonant circuit arrangement, and means for connecting said series circuit arrangement in parallel with said resonant circuit arrangement.

2. A resonant circuit arrangement having input terminals, comprising means for applying input oscillations to said input terminals, a first variable capacitor and a first inductor connected in parallel relationship between said input terminals for adjusting the frequency of said circuit arrangement in relatively broad increments, a second variable capacitor for adjusting the frequency of said circuit arrangement in relatively narrow increments independently of said first variable capacitor, said second variable capacitor having a relatively low maximum capacitance, a second inductor connected in parallel circuit arrangement with said second variable capacitor, said second inductor having an inductance value at which the resonant frequency of said last-mentioned parallel circuit arrangement exceeds the resonant frequency of said resonant circuit arrangement, a non-variable capacitor connected in series circuit arrangement with said last-mentioned parallel circuit arrangement, said non-variable capacitor having a capacitance value at which the resonant frequency of said series circuit arrangement is less than the resonant frequency of said resonant circuit arrangement, and means for connecting said series circuit arrangement in parallel with said resonant circuit arrangement.

References Cited in the file of this patent

UNITED STATES PATENTS

| | | |
|---|---|---|
| 2,210,379 | Pasma | Aug. 6, 1940 |
| 2,468,148 | Wachtman | Apr. 26, 1949 |
| 2,486,692 | Van Der Heem | Nov. 1, 1949 |
| 2,528,167 | Pan et al. | Oct. 31, 1950 |
| 2,617,035 | Jannsen et al. | Nov. 4, 1952 |